(12) United States Patent
Ramakrishnan et al.

(10) Patent No.: US 7,095,107 B2
(45) Date of Patent: Aug. 22, 2006

(54) BALL ASSIGNMENT SCHEMES FOR INTEGRATED CIRCUIT PACKAGES

(75) Inventors: Arun Ramakrishnan, Sunnyvale, CA (US); Anand Govind, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 72 days.

(21) Appl. No.: 11/005,732

(22) Filed: Dec. 7, 2004

(65) Prior Publication Data

US 2006/0118929 A1    Jun. 8, 2006

(51) Int. Cl.
*H01L 23/52* (2006.01)
*H01L 23/48* (2006.01)

(52) U.S. Cl. ............ 257/691; 257/693; 257/697; 257/773; 257/778

(58) Field of Classification Search .......... 257/691, 257/693, 697, 773, 780–782, 784, 786, E21.503
See application file for complete search history.

(56) References Cited

U.S. PATENT DOCUMENTS

| | | | |
|---|---|---|---|
| 5,847,936 A * | 12/1998 | Forehand et al. ........ 361/794 |
| 6,177,733 B1 * | 1/2001 | Obara ..................... 257/786 |
| 6,198,635 B1 | 3/2001 | Shenoy | |
| 6,297,565 B1 * | 10/2001 | Shiflet ..................... 257/786 |
| 6,388,890 B1 | 5/2002 | Kwong et al. | |
| 6,407,462 B1 * | 6/2002 | Banouvong et al. ...... 257/787 |
| 6,594,811 B1 * | 7/2003 | Katz ....................... 716/12 |
| 6,650,014 B1 * | 11/2003 | Kariyazaki ............... 257/737 |
| 6,762,366 B1 | 7/2004 | Miller et al. | |
| 6,762,495 B1 * | 7/2004 | Reyes et al. ............. 257/737 |
| 6,834,427 B1 * | 12/2004 | Cornelius et al. ........ 29/840 |
| 2005/0050505 A1 * | 3/2005 | Bednar et al. ............ 716/12 |

* cited by examiner

*Primary Examiner*—Jasmine Clark
(74) *Attorney, Agent, or Firm*—Westman, Champlin & Kelly P.A.

(57) ABSTRACT

The present disclosure is directed to ball assignment schemes for ball grid array packages in integrated circuits with increased signal count. The ball assignment scheme includes an array of electrical contacts. The array has a first diagonal including a pair of signal contacts adjacent to a pair of first-type voltage supply contacts. The array further includes a crossing diagonal having a pair of adjacent second-type voltage supply contacts, which crosses the first diagonal between the pair of signal contacts such that the pair of second-type voltage supply contacts oppose one another relative to the first diagonal.

20 Claims, 9 Drawing Sheets

BALL ASSIGNMENT SCHEMES FOR INTEGRATED CIRCUIT PACKAGES

FIELD OF THE INVENTION

The present disclosure relates to integrated circuits. More particularly, the present disclosure relates to ball assignment schemes used in ball grid array and other packages to increase signal count and maintain quality electrical performance.

BACKGROUND OF THE INVENTION

A "flip chip" refers to an integrated circuit that includes at least one semiconductor die, which is bonded circuit-side down to a substrate, with direct electrical interconnection between the die and the substrate. Because the die is connected directly to the substrate, traditional bond wires are eliminated. The substrate can be a passive carrier such as a printed circuit board, or it can be another semiconductor chip. The substrate is normally bonded directly to a motherboard. Other flip chips and other integrated circuits employing a variety of more traditional packages such as lead frame packages, surface mounts, pin grid arrays and the like can also be mounted to the motherboard.

One purpose that the substrate serves is to allow the input-output (I/O) signals on the die to "escape" the die onto the motherboard. Die are usually quite small, and contain as many as hundreds of I/O signals, as well as numerous power and ground connections. There can be "bumps" (e.g., solder spheres) on the surface pads of the die to facilitate electrical connections to the substrate. These bumps are densely packed together onto the small die. It may not be practical to attempt to bond such tightly packed bumps to a motherboard. The substrate serves the purpose of spreading out these densely packed bumps to a much less dense spacing, so that these I/O signals and power and ground connections can then be connected to the motherboard.

When the die is bonded to the substrate, the bumps on the die are the points of physical and electrical contact between the die and the substrate. The bumps carry electrical signals including power and ground to and from the die. The substrate has a surface, typically the surface opposite the die, which has a plurality of contacts called pads or lands. A solder ball is typically attached to each land for soldering to the motherboard. The solder balls are collectively referred to as a ball grid array, because they are usually arranged in a grid pattern. A "ball assignment scheme" is a pattern in which the I/O signals, power and ground balls are assigned on the substrate.

Each bump in the die bonding area is electrically connected to a corresponding ball in the ball grid array through conductive segments called "traces" along one or more of the layers in the substrate and through one or more "vias" between the layers.

The I/O signals being routed through the substrate for communication between the die and motherboard can include many different types of signals, such as single-ended signals and differential signal pairs. A differential signal pair consists of two adjacent I/O contact pads within the die bonding area, which are routed to two adjacent balls in the package. Ideally, the routing for the two traces in each differential pair should be identical in terms of the length of the routes, the number of vias in the routes and the planes between which the traces are routed.

As more and more functionality is being programmed into integrated circuits, chip manufacturers are being compelled to come up with innovative ways to satisfy the higher signal count requirement on the die and on the package. Chip manufacturers often do not prefer to increase the package size to accommodate the increase in functionality because of the associated expenses involved with manufacturing larger packages. Chip manufacturers would prefer instead to increase the number of available I/O signals in a given body size, i.e., increase signal density, to accommodate for the increased chip functionality. In order to increase signal density, chip manufacturers would prefer to increase the signal-to-power and signal-to-ground ratios on the package, thereby increasing the signal count by converting some the previously power and ground balls to I/O signals.

Higher I/O signal to ground and I/O signal to power ratios call for a new ball assignment scheme that includes improved features to suit the improved functionality. But simply increasing signal count can unfortunately lead to electrical performance degradation and increased electrical noise. Also, new ball assignment schemes can increase printed circuit board costs, and complicate trace routing on the substrate and the printed circuit boards.

SUMMARY OF THE INVENTION

The present disclosure is directed to improved ball assignment schemes for ball grid array packages with increased signal count. These ball assignment schemes are designed to reduce printed circuit board costs, facilitate trace routing on the substrate and the printed circuit boards, and provide good coupling of the signals to the ground and power balls in order to improve electrical performance and reduce electrical noise. The ball assignment schemes can be readily adapted for multiple signal ball to ground ball to power ball ratios, such as 4:1:1, 6:1:1, and the like.

In one aspect, this disclosure is directed to a grid array of electrical contacts in an integrated circuit package. The grid array includes a first diagonal including a pair of signal contacts adjacent to a pair of first-type voltage supply contacts. The array further includes a crossing diagonal having a pair of adjacent second-type voltage supply contacts, which crosses the first diagonal between the pair of signal contacts such that the pair of second-type voltage supply contacts oppose one another relative to the first diagonal.

In another aspect, this disclosure is directed to an array of electrical contacts on a substrate. The array includes a plurality of parallel and spaced-apart first diagonals, each first diagonal including signal contacts and first-type voltage supply contacts distributed along the first diagonal. A plurality of second diagonals are located between and parallel to the first diagonals. Each second diagonal includes a plurality of signal contacts. The second diagonals that are adjacent the first diagonals further include second-type voltage supply contacts distributed along the second diagonal such that pairs of the second-type voltage supply contacts oppose one another relative to the corresponding first diagonal.

In another aspect, this disclosure is directed to a grid array of electrical contacts in an integrated circuit package. The grid array includes a plurality of adjacent grid boxes. Each grid box includes sixteen electrical contacts arranged in a four rows of four contacts. The sixteen electrical contacts in each grid box include twelve signal contacts, two ground contacts along a first diagonal, and two power contacts along a second diagonal (this is for achieving a 6:1:1 ratio of IO signal balls to power and ground balls in the package). The first diagonal crosses the second diagonal in the grid box.

The ball assignment scheme of the present disclosure is applicable to all full-area array and peripheral-area array flip chip and wirebond packaging technologies, and the like.

DETAILED DESCRIPTION OF ILLUSTRATIVE EMBODIMENTS

This disclosure relates to ball assignment schemes used in ball grid arrays to increase signal count and maintain quality electrical performance in various packaging technologies in integrated circuits. The disclosure, including the figures, describes the integrated circuits, ball grid arrays and ball assignment schemes, among others, with reference to several illustrative examples. Other examples are contemplated and are mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed, and still be within the scope of the claims.

Figure 1:
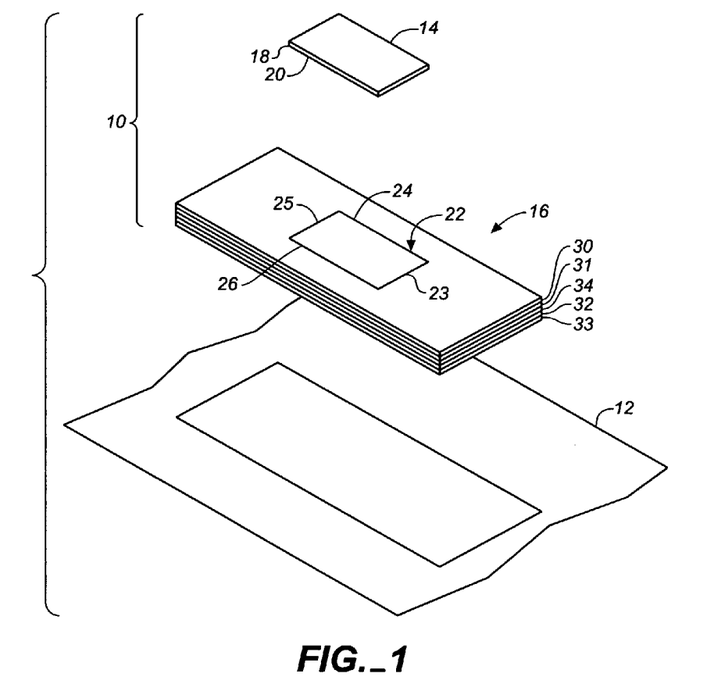
FIG. 1 is an exploded perspective view of a flip chip package for mounting to a printed circuit board, according to one embodiment of the present disclosure.

FIG. 1 is an exploded, perspective view of a flip chip 10, which can be mounted to a motherboard 12 according to one embodiment of the present disclosure. A flip chip is disclosed here as it provides a suitable environment for the ball assignment schemes of the present disclosure. Other packaging technologies, such as wirebond or others, can also provide suitable environments for the present disclosure.

Flip chip 10 includes an integrated circuit die 14 and a substrate 16. Die 14 includes an integrated circuit 18 formed on a face side 20 of die 14. Die 14 is mounted face side down to substrate 16 and electrically connected and bonded to substrate 16 within die bonding area 22. Electrical connections are typically performed with soldering, for example. Die bonding area 22 includes edges 23, 24, 25 and 26, which define a perimeter of the die bonding area.

Substrate 16 typically includes a plurality of conductive layers. In one embodiment, substrate 16 includes a total of four conductive layers, including a top layer 30, a second layer 31, a third layer 32 and a bottom layer 33, which are fabricated on a core 34 and are electrically isolated from one another by dielectric layers. The dielectric layers are formed of an insulating dielectric material such as polyimide, PCB laminate, Polytetrafluoroethylene (PTFE), FR4, BT resin, ceramic or any other insulator used for semiconductor packages. Also, other types of substrates can be used, such as "decals" or printed double-sided flex tape with or without stiffeners. The bottom layer 33 of substrate 16 is mounted to motherboard 12. The conductive layers on substrate 16 carry "traces" of conductive segments for interconnecting signals on die 14 with motherboard 12.

Figure 2:
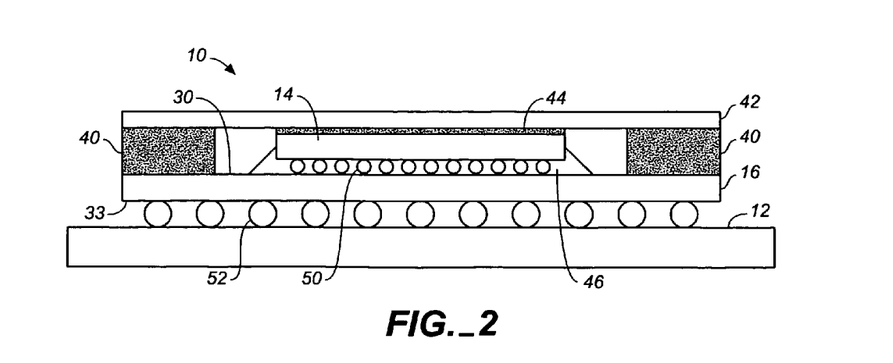
FIG. 2 is a cross-sectional view of the flip chip package mounted to the printed circuit board.

FIG. 2 is a cross-sectional view of flip chip 10 mounted to motherboard 12. Flip chip 10 has a package formed by substrate 16, stiffener 40 and heat spreader 42, and underfill 46. Heat spreader 42 is attached to die 14 with an adhesive 44.

The face side 20 of die 14 includes a plurality of "bumps" 50 (such as solder spheres in the example) to facilitate electrical connections from the face side 20 of the die 14 to the top conductive layer 30 of substrate 16. These bumps are densely packed together onto the small die. It may not be practical to attempt to bond such tightly packed bumps to motherboard 12. Therefore, substrate 16 serves the purpose of spreading out these densely packed bumps to a much less dense spacing so that the I/O signals along with power and ground contacts can be connected to motherboard 12.

A plurality of solder balls 52, as illustrated in the example, are attached to the bottom conductive layer 33 of substrate 16 to facilitate the electrical interconnections between substrate 16 and motherboard 12. In one embodiment, solder balls 52 are arranged in a ball grid array on bottom layer 33. Solder balls 52 are much less densely packed than bumps 50. Each bump 50 is electrically connected to a corresponding one of the solder balls 52 through conductive segments in one or more of the layers in substrate 16 and through one or more electrical vias between the layers.

The I/O signals on die 14 can include different types of signals such as single-ended signals and differential signal pairs. Differential signal pairs include adjacent I/O slots that are routed from corresponding bumps 50 to adjacent solder balls 52 through substrate 16. The conductive traces through substrate 16 of each signal in a differential signal pair should ideally be identical to one another in terms of the length of conductive segments, the number of vias and the layers on which the conductive segments are routed. However, this becomes difficult due to the number of I/O signals and the density of the bumps in a typical flip chip package.

Figure 3:
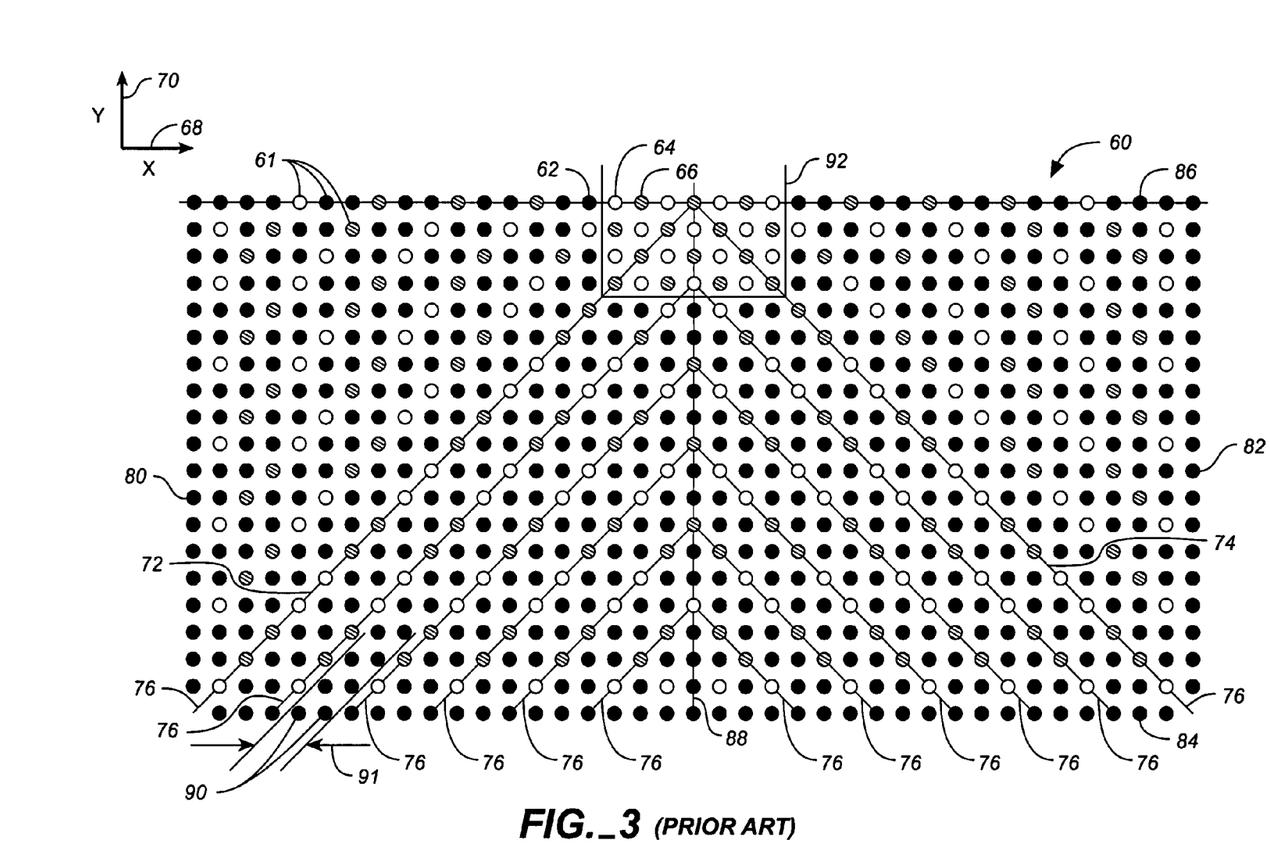
FIG. 3 is a fragmentary schematic view of a prior art ball assignment scheme.

FIG. 3 is a fragmentary schematic plan view of a prior art ball assignment scheme 60. A ball assignment scheme is a pattern in which signals, power, and ground balls are assigned to electrical contacts on the bottom layer of the substrate 16. In the example shown in FIG. 3, ball assignment scheme 60 includes a plurality of electrical contacts 61, which are arranged in a planar grid pattern. The solder balls 52 shown in FIG. 2 electrically and physically couple contacts 61 with corresponding contacts on the motherboard 12.

The example shows a symmetrical grid pattern for illustrative purposes only, but a symmetrical grid pattern includes several manufacturing advantages. The ball assignment scheme 60 shown is only a portion of the entire ball assignment scheme of a package. In one example, the ball grid array shown is a quadrant of the entire ball grid array of a package. The disclosure is presented with reference to portions of the entire ball grid array for convenience.

In this disclosure, black or solid circles represent contacts dedicated to carrying I/O signals, such as signal contact 62. Hollow circles represent contacts dedicated to carrying ground contacts, such as ground contact 64. Crosshatch circles represent contacts dedicated to carrying power signals, such as power contact 66.

For ease of reference, several other conventions are used throughout this disclosure. An x-axis 68 extends horizontally, and an orthogonal y-axis 70 extends vertically in the figures. The ball assignment schemes of this disclosure have contacts arranged in columns extending parallel to the y-axis and in rows extending parallel to the x-axis. The contacts are also arranged in diagonals. "Positive diagonals" generally have a positive slope with respect to the x-y axes, such as diagonal 72. "Negative diagonals" have a negative slope with respect to the x-y axes, such as diagonal 74. In the example shown, the positive diagonals are orthogonal to negative diagonals. The portion of the ball grid array shown includes left grid edge 80, right grid edge 82, bottom grid edge 84 and top grid edge 86. The top grid edge can represent a central row of the entire ball grid array, with the top half of the array (not shown) being a mirror image of the bottom half. These reference numerals are repeated in other ball assignment schemes in this disclosure.

Referring to FIG. 3, the scheme 60 includes a plurality of ground/power diagonals 76. The ground/power diagonals 76 include ground contacts 64 and power contacts 66 arranged along the diagonals. Ground/power diagonals 76 include positive diagonals and negative diagonals. The area between the outer-most ground/power diagonals 76 and bottom edge 84 represents one quadrant of the ball assignment scheme. In this scheme, each ground/power diagonal 76 essentially includes a repeating pattern of two power contacts 66 followed by two ground contacts 64.

The prior art ball assignment scheme 60 defines a quadrant of six positive-sloping ground/power diagonals 76 extending from bottom edge 84 toward central column 88 and six negative-sloping ground/power diagonals 76 extending from bottom edge 84 toward central column 88. The ground/power diagonals 76 are spaced apart by two parallel signal diagonals 90 as indicated by arrows 91 in the illustration. Each signal diagonal includes only signal contacts 62, except in a central core region 92 of scheme 60.

The ball assignment scheme 60 has several advantageous and electrical performance enhancing characteristics. Among these, three advantageous characteristics are identified here. For example, each signal contact 62 is located only "one contact away" from both a ground contact 64 and a power contact 66. An adjacent ground contact 64 or power contact 66 can be either in the x, y direction, or a diagonal direction from a given signal contact 62. Placing signal contacts 62 adjacent to ground and power contacts 64, 66 helps reduce crosstalk and electrical noise in the package. Also, the assignment scheme permits the sharing of vias between pairs of ground contacts 64 or power contacts 66 on the substrate 16 to create routing channels in or on the motherboard. The sharing of vias to create routing channels helps reduce the number of layers required for routing the signals in the motherboard 12.

Still further, differential signal pairs are typically assigned to pairs of adjacent contacts 61 in the x or y direction, not in the diagonal direction, in order to facilitate common routing lengths between the signals in the pair. Differential signal pairs assigned to adjacent contacts in the x or y directions allow for a reduced trace length difference between the two signals as compared to differential pairs assigned in the diagonal direction. At typical high frequencies, electrical performance degrades with differential signals having different trace lengths.

Figure 4:
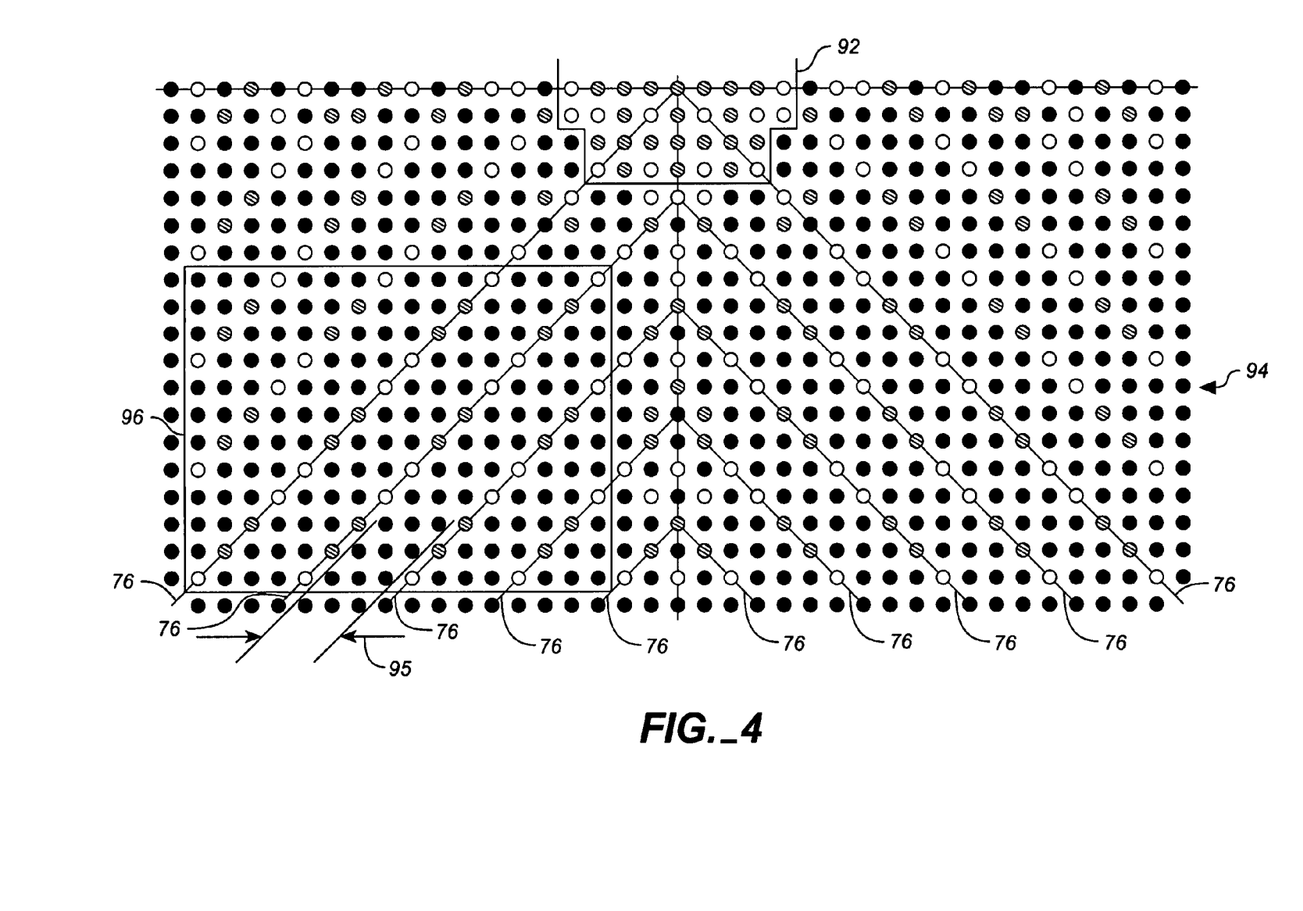
FIG. 4 is a fragmentary schematic view of a ball assignment scheme having a signal count greater than the ball assignment scheme of FIG. 3.

FIG. 4 is a fragmentary schematic view of another ball assignment scheme 94. The ball assignment scheme 94 includes greater ratios of signal contacts 62 to ground contacts 64 and signal contacts 62 to power contacts 66 as compared to the prior art ball assignment scheme 60 shown above. In this example, the package or body size for scheme 94 (and other schemes discussed below) is intended to be the same as the package or body size for prior art scheme 60. As mentioned above, greater I/O signal to power and to ground ratios may be desired as a result of more functionality programmed into the chip 10. The ball assignment scheme 94 is an extension of the prior art scheme 60 in that in order to accommodate the greater number of signal contacts 62, the ground/power diagonals 76 are spaced apart from each other by three parallel signal diagonals 90, indicated by arrows 95, rather than two signal diagonals as shown above in the prior art scheme 60. Although ball assignment scheme 94 achieves a higher signal-to-ground/power ratio, the ball assignment scheme does not include all of the advantageous electrical performance enhancing characteristics of the prior art ball assignment scheme 60. These deficiencies are explained below with reference to an exemplary portion 96 of scheme 94 shown enlarged in FIG. 5.

Figure 5:
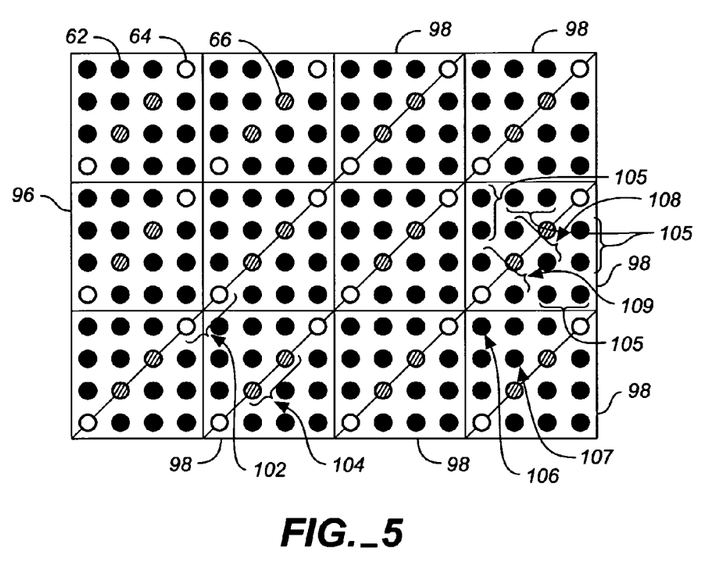
FIG. 5 is an enlarged schematic view of a portion of the ball assignment scheme of FIG. 4.

FIG. 5 shows an enlarged schematic view of the exemplary portion 96 of the ball assignment scheme 94. The exemplary portion 96 includes grid box lines forming a plurality of four by four grid boxes 98 to make the illustration more clear. Each grid box 98 includes the same pattern of contacts 62, 64, 66.

The ball assignment scheme 94 includes only one of the three above-identified advantageous characteristics. The ball assignment scheme 94 enables vias to be shared between pairs of adjacent ground contacts, indicated at 102, or pairs of adjacent power contacts, indicated at 104, to create additional routing channels. (This is also true for corresponding contacts in the other grid boxes.) The other two identified advantageous characteristics, however, are not provided by the scheme 94. For example, while signal contacts 106, 107, are "one contact away" from one of the ground contacts 64 and power contacts 66, they are "two contacts away" from the other of the ground contacts 64 and power contacts 66. (This is also true for corresponding contacts in the other grid boxes.) Signal contact 106 is "two contacts away" from the nearest power contact 66, and signal contact 107 is "two contacts away" from the nearest ground contact 64. Also, only some of the differential pairs, for example pairs 105, are assigned in the x or y direction. Two differential pairs in each grid box 98, for example pairs 108, 109, are assigned in the diagonal direction. The lack of these two identified characteristics can result in performance degradation.

Figure 6:
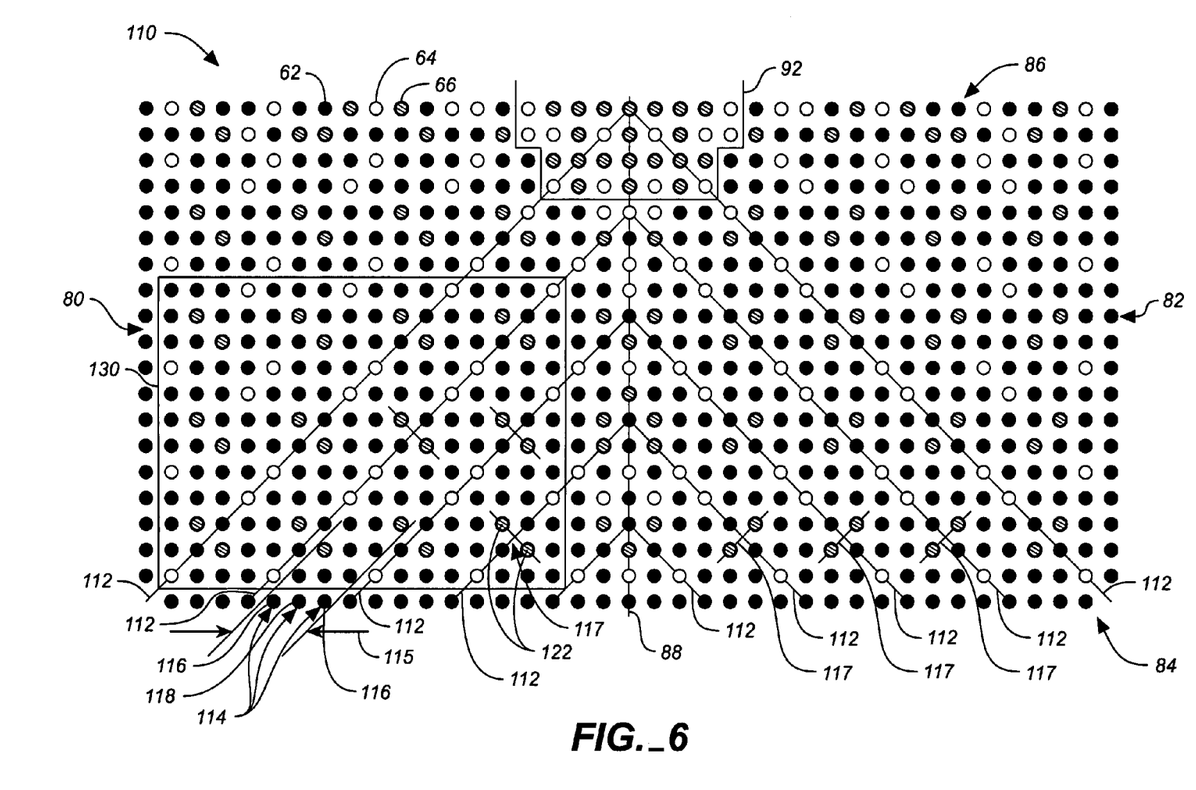
FIG. 6 is a fragmentary schematic view of a ball assignment scheme according to one embodiment of the disclosure.

FIG. 6 is a fragmentary schematic plan view of an improved ball assignment scheme 110. Again, the same reference numerals are used in FIG. 6 as were used in the previous figures for the same or similar elements. Ball assignment scheme 110 includes a first plurality of parallel diagonals 112 and a second plurality of parallel diagonals 114, which are located between adjacent pairs of the diagonals 112. In order to increase the signal-to-power and signal-to-ground ratios as compared to the scheme shown in FIG. 3, there are more than two diagonals 114 located between adjacent pairs of diagonals 112. In the example shown in FIG. 6, there are three diagonals 114 between adjacent pairs of diagonals 112, as indicated by arrows 115. However, there can be one or more diagonals 114 between adjacent pairs of diagonals 112 in alternative embodiments of the disclosure.

Each of the diagonals 112 includes a first type of voltage supply contacts, such as ground contacts 64 distributed along the diagonal with at least some signal contacts 62. In the example shown in FIG. 6, diagonals 112 include a repeating pattern of pairs of adjacent ground contacts 64 interleaved with pairs of adjacent signal contacts 62. Diagonals 114 include predominantly signal contacts 62. However, the diagonals 114 that are immediately adjacent to diagonals 112 further include a second type of voltage supply contacts, such as power contacts 66, distributed with the signal contacts 62 along the diagonal. The diagonals 114 that are spaced more than one diagonal away from the diagonals 112, for example, include only signal contacts 62.

The term "voltage supply contact" as used in the specification and claims can refer to any type of supply contact, such as a ground contact, a power contact or both. The term "diagonal" can include the entire set of contacts in a specific diagonal of the ball assignment scheme or can include only a subset or portion of the contacts in a particular diagonal of the ball assignment scheme. For example, the central column 88 and central region 92 in FIG. 6 do not form part of the diagonals 112, 114. Diagonals 112, 114 are formed on each side of the central column 88.

As mentioned above, the diagonals 114 that are adjacent to diagonals 112 include power contacts 66. These power contacts are distributed such that pairs 122 of power contacts 66 oppose one another relative to the corresponding diagonal 112. Each pair 122 of opposing power contacts 66 form an orthogonal diagonal 117 that crosses the corresponding diagonal 112 between two adjacent signal contacts 62 in the diagonal 112. Accordingly, if the diagonal 112 is a positive diagonal, the crossing diagonal 117 of the pair 122 of power contacts 66 is a negative diagonal.

Comparing the ball assignment scheme shown in FIG. 6 with that shown in FIG. 4, the diagonals 112 and 114 are similar. However, the power contacts 66 in diagonals 76 (FIG. 4) are rotated 90 degrees relative to diagonals 112 (FIG. 6) to form diagonals 117, and the corresponding contact positions in diagonals 112 are replaced with signal contacts 62.

It is contemplated that the ground contacts 64 could be interchanged with the power contacts 66 in the diagonals of this disclosure, such as in diagonals 112 and 117 in the assignment scheme 110 shown in FIG. 6. Also, other spacings and patterns can be used in alternative embodiments.

Figure 7:
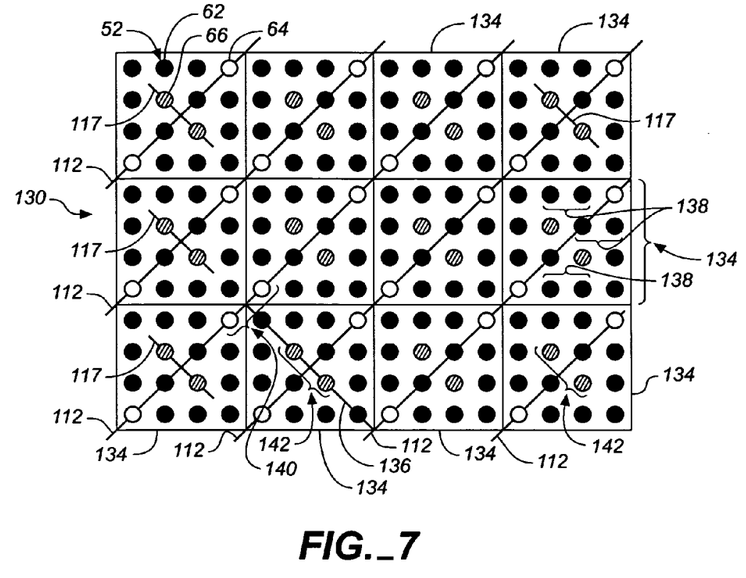
FIG. 7 is an enlarged schematic view of a portion of the ball assignment scheme of FIG. 6.

FIG. 7 shows an enlarged schematic view of an exemplary portion 130 of the ball assignment scheme 110 shown in FIG. 6. The exemplary portion 130 includes grid box lines forming a plurality of adjacent four by four grid boxes 134 to make the illustration more clear. For each of the sixteen contacts 52 in a given grid box 134, two are ground contacts 64, two are power contacts 66, and twelve are signal contacts 62. The ratio of signal contacts 62 to ground contacts 64 to power contacts is therefore 6:1:1 in the exemplary portion 130. Each four by four grid box 134 includes a segment of a diagonal 112 having a pair of adjacent signal contacts 62 between ground contacts 64. Each grid box 134 also includes a cross-diagonal 136 having a pair of adjacent power contacts 66 between signal contacts 62. The pattern in one of the grid boxes 134 is the same for all the grid boxes in the exemplary portion 130. The remaining contacts in each grid box 134 are signal contacts 62.

Although ball assignments scheme 110 has increased signals-to-power/ground ratios, the ball assignment scheme includes all three of the above-identified advantageous performance characteristics. For example, all of the signal contacts 62 are "one contact away" from a nearest ground contact 64 and a nearest power contact 66 in the either the x, y, or diagonal direction. Also, all of the signal contacts 62 can be grouped in differential pairs, such as pairs 138, in the x or y directions. None of the signal pairs must be grouped in a diagonal direction. This provides for more equal routing lengths for differential signal pairs. In addition since the scheme arranges adjacent ground contacts 64 in pairs 140 and adjacent power contacts 66 in pairs 142, the printed circuit board to which the substrate is mounted can include one via for each pair of ground contacts or power contacts rather than one via for each ground and power contact. By sharing ground and power vias, more space is reserved on the printed circuit board for additional routing channels along the board. With more routing channels, the task of routing signal wires out from the substrate signal contacts becomes less complex.

Figure 8:
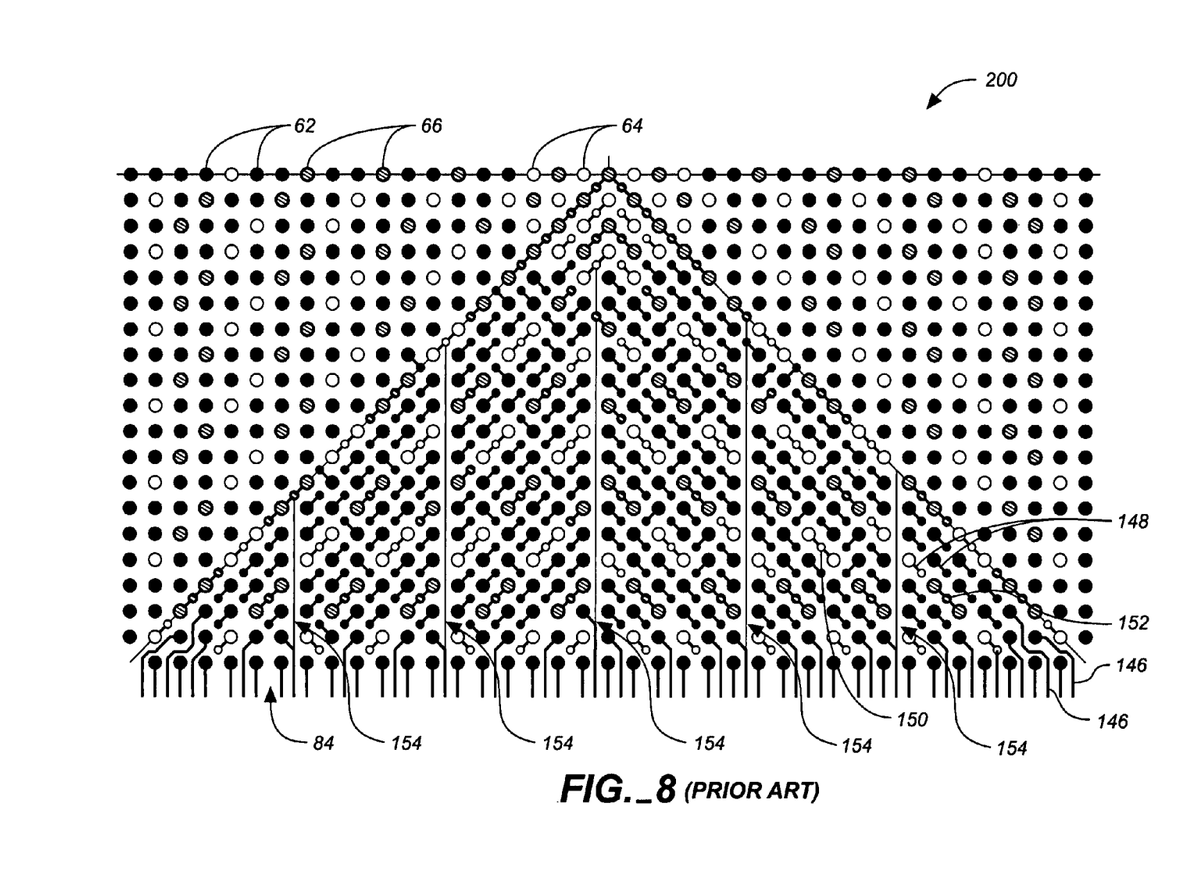
FIG. 8 is a schematic view of a prior art printed circuit board routing scheme for the prior art ball assignment scheme shown in FIG. 3.

FIG. 8 is a schematic view illustrating an example of a printed circuit board or substrate routing scheme 200 corresponding to the ball assignment scheme 60 shown in FIG. 3 (having lower signal-to-ground/power ratios). The printed circuit board has a ball assignment scheme having the same pattern of electrical contacts (signal contacts 62, ground contacts 64 and power contacts 66) as that of the ball grid array on the substrate (shown in FIG. 3). Thus, when the substrate is mounted to the printed circuit board each of the electrical contacts on the substrate electrically and physically connects to a corresponding electrical contact on the board. The nets coupled to the electrical contacts are then routed out of the substrate mounting area to other locations on the board.

FIG. 8 shows an example of a routing pattern on the board for a portion of the substrate mounting area. Each electrical contact 62, 64, 66 is connected to a conductive trace 146. Some of the traces 146 are routed to a periphery of the substrate mounting area, past edge 84, and other traces 146 are routed to a via 140, which routes the trace to another conductive layer on the board.

Adjacent ground contacts 64 generally are able to share a via, as shown at 150. Similarly, adjacent power contacts 66 generally are able to share a via, as shown at 152. The orientation of the vias 148 relative to the corresponding contacts can be configured to create five channels 154 where generally no vias exist between the columns of electrical contacts. The sharing of vias to create routing channels helps reduce the number of layers of the substrate 16, which is an advantage of the prior art ball assignment scheme 60.

Figure 9:
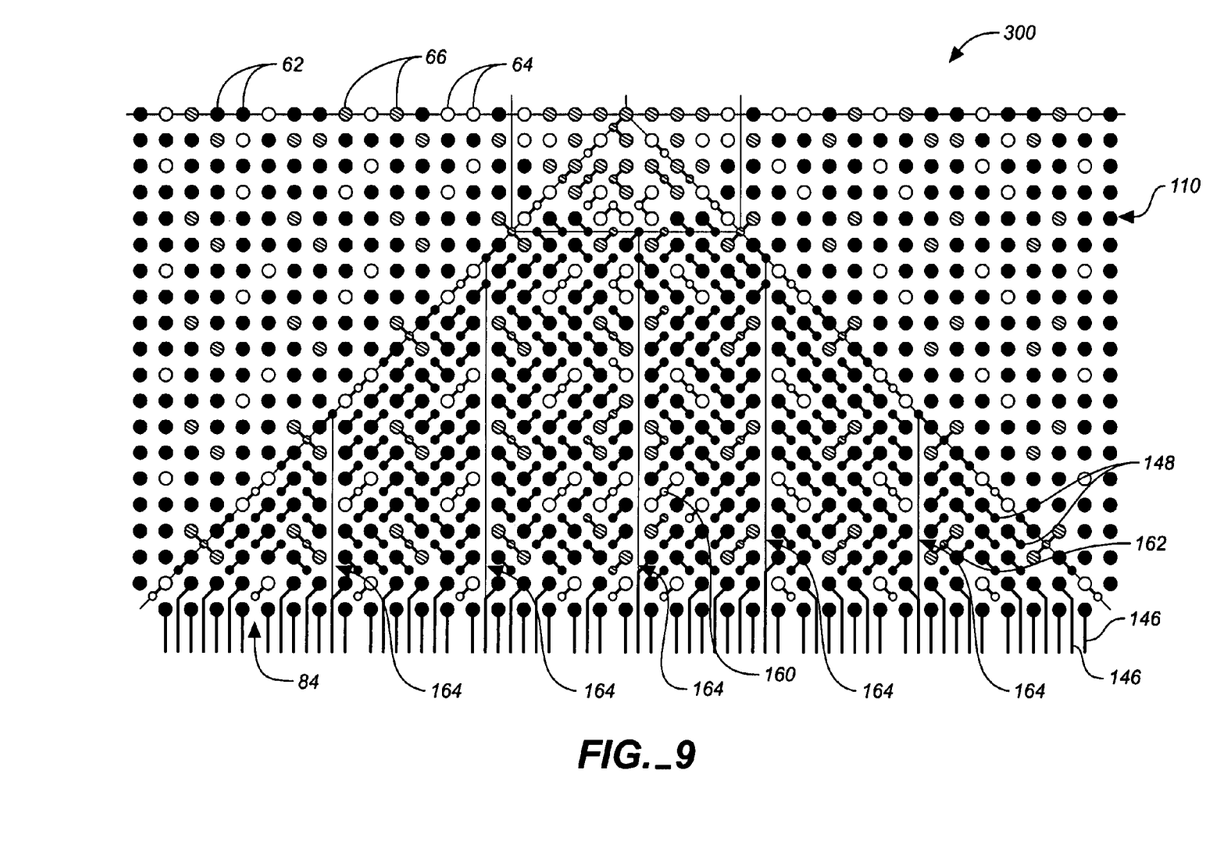
FIG. 9 is a schematic view of a printed circuit board routing scheme according to one embodiment of the present disclosure for the ball assignment scheme shown in FIG. 6.

FIG. 9 is a schematic view illustrating an example of a printed circuit board or substrate routing scheme 300 corresponding to the ball assignment scheme 110 shown in FIG. 6 (having higher signal-to-ground/power ratios). The printed circuit board has a ball assignment scheme having the same pattern of electrical contacts (signal contacts 62, ground contacts 64 and power contacts 66) as that of the ball grid array on the substrate (shown in FIG. 6).

Although the ball assignment scheme has more signal contacts, the assignment scheme 110 still provides for via sharing between adjacent ground and power contacts, which allows the vias 148 to be oriented to create additional routing columns 164 on the board. For example, adjacent ground contacts 64 generally are able to share a via, as shown at 160. Similarly, adjacent power contacts 66 generally are able to share a via, as shown at 162.

Figure 10:
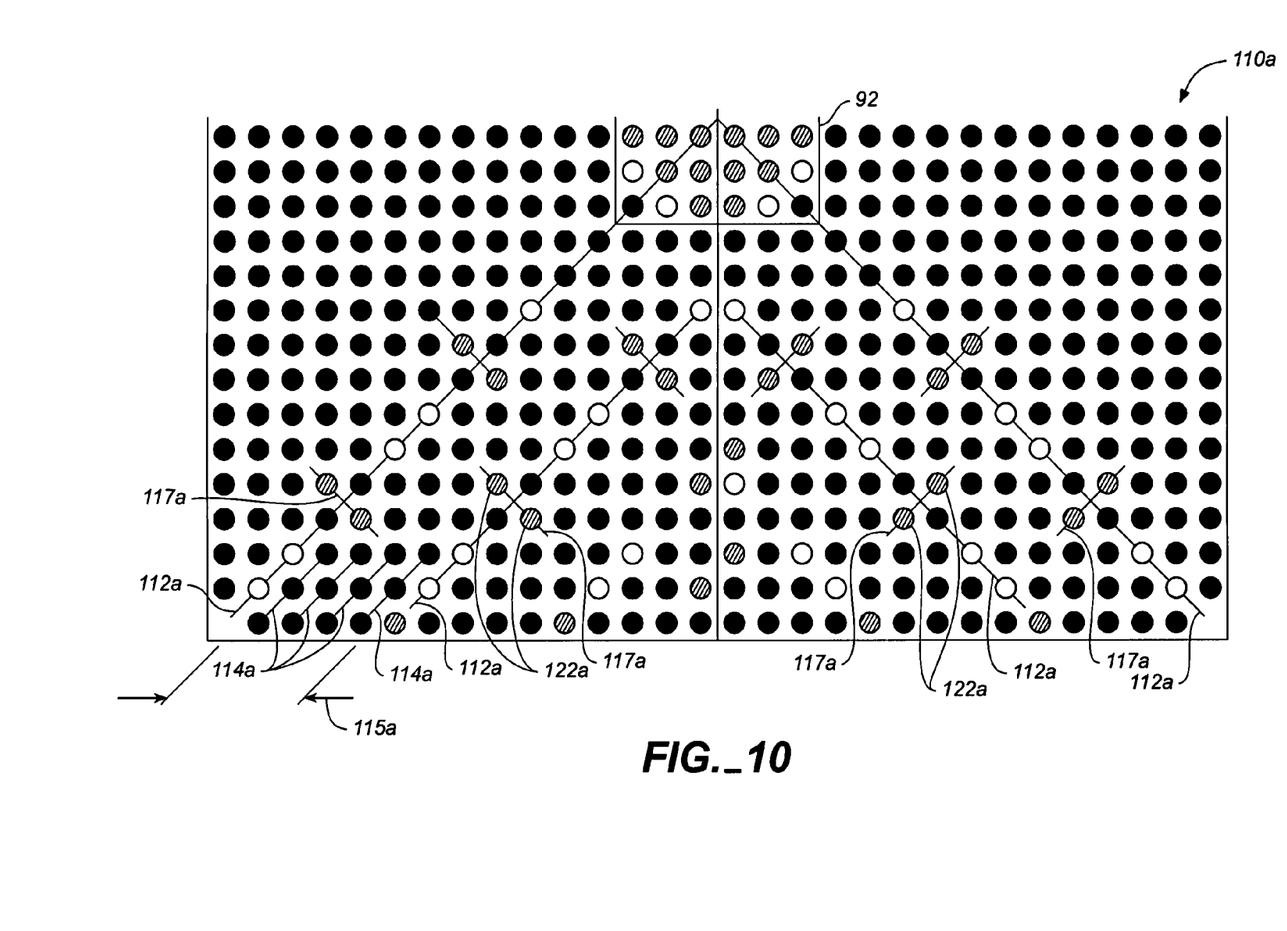
FIG. 10 is a fragmentary schematic view of a ball assignment scheme according to another embodiment of the disclosure, which has a greater signal count than that shown in FIG. 6.

FIG. 10 is a fragmentary schematic plan view of another improved ball assignment scheme 110a, which has a signal-to-ground-to-power ratio of 8:1:1. The example includes a plurality of parallel diagonals 112a spaced-apart from each other by four parallel diagonals 114a, indicated by arrows 115a. The diagonals 112a generally include a repeating pattern of pairs of adjacent signal contacts 62 interleaved with pairs of adjacent ground contacts 64. The diagonals 114a that are adjacent the diagonals 112a include both signal contacts and power contacts. The power contacts are distributed such that pairs 122a of power contacts 66 oppose one another relative to the corresponding diagonal 112a. Each pair 122a of opposing power contacts 66 form an orthogonal diagonal 117a that crosses the corresponding diagonal 112a between two adjacent signal contacts 62 in the diagonal 112.

The embodiments described above provide an optimized routing option on the printed circuit board for packages with higher IO counts, while maintaining the same electrical performance. The combination of increasing the number of signal rows (or diagonals) between the traditional ground-power rows and flipping the orientation of the power contacts along the ground-power rows can be used to generate ball assignment schemes for packages with a variety of signal-to-ground-to-power ratios (e.g., 4:1:1, 6:1:1, 8:1:1, etc.) This approach is applicable to a variety of different types of integrated circuit package technologies, such as full-area array and peripheral area array flip chip and wire bond technologies. For example, this approach is applicable to LSI Logic's 4L Flip Chip, 6L Flip Chip, FlxIO, and RapidChip® product families available from LSI Logic Corporation of Milpitas, Calif., U.S.A.

The present invention has now been described with reference to several embodiments. The foregoing detailed description and examples have been given for clarity of understanding only. Those skilled in the art will recognize that many changes can be made in the described embodiments without departing from the scope and spirit of the invention. Thus, the scope of the present invention should not be limited to the exact details and structures described herein, but rather by the appended claims and equivalents.

What is claimed is:

1. A grid array of electrical contacts in an integrated circuit package, the grid array comprising:
    a first diagonal including a pair of adjacent signal contacts and an adjacent a pair of adjacent first-type voltage supply contacts; and
    a crossing diagonal including a pair of adjacent second-type voltage supply contacts, which crosses the first diagonal between the pair of signal contacts such that the pair of second-type voltage supply contacts oppose one another relative to the first diagonal.

2. The grid array of claim 1 wherein the first-type voltage supply contacts are ground contacts and the second-type voltage supply contacts are power contacts.

3. The grid array of claim 1 wherein the first diagonal is orthogonal to the crossing diagonal.

4. The grid array of claim 1 wherein the first diagonal comprises a repeating pattern of pairs of adjacent signal contacts interleaved with pairs of adjacent first-type voltage supply contacts along the first diagonal.

5. The array of claim 4 wherein array further comprises:
    a plurality of crossing diagonals, including the first-mentioned crossing diagonal, each crossing diagonal including a pair of adjacent second-type voltage supply contacts, which crosses the first diagonal between a corresponding pair of signal contacts.

6. The grid array of claim 1 wherein the grid array includes a plurality of spaced-apart and parallel first diagonals.

7. The grid array of claim 6 and further comprising:
    a plurality of second diagonals located between and parallel to the first diagonals, each second diagonal including a plurality of signal contacts distributed along the second diagonal.

8. The grid array of claim 7 and further comprising:
    the second diagonals that are immediately adjacent the first diagonals further include the second-type voltage supply contacts, which are distributed along the second diagonal such that pairs of the second-type voltage supply contacts oppose one another relative to the corresponding first diagonal and form the crossing diagonals.

9. The grid array of claim 7 wherein there are three second diagonals between each corresponding pair of the first diagonals.

10. The grid array of claim 7 wherein there are four second diagonals between each corresponding pair of the first diagonals.

11. The grid array of claim 1 wherein the integrated circuit package includes a flip chip.

12. An array of electrical contacts on a substrate, the array comprising:
    a plurality of parallel and spaced-apart first diagonals, each first diagonal including signal contacts and first-type voltage supply contacts distributed along the first diagonal; and
    a plurality of second diagonals located between and parallel to the first diagonals, each second diagonal including a plurality of signal contacts, wherein the second diagonals that are adjacent the first diagonals further include second-type voltage supply contacts distributed along the second diagonal such that pairs of the second-type voltage supply contacts oppose one another relative to the corresponding first diagonal.

13. The array of claim 12 wherein each of the signal contacts in the array is located within one contact position from a nearest first-type voltage supply contact and a nearest second-type voltage supply contact.

14. The array of claim 12 wherein each of the first diagonals comprises a repeating pattern of pairs of adjacent signal contacts interleaved with pairs of adjacent first-type voltage supply contacts along the first diagonal.

15. The array of claim 14 wherein the pairs of the second-type voltage supply contacts that oppose one another relative to the corresponding first diagonal form a crossing diagonal, which crosses the first diagonal between a corresponding pair of the signal contacts in the first diagonal.

16. The array of claim 12 wherein there are three second diagonals between each corresponding pair of the first diagonals.

17. The array of claim 12 wherein there are four second diagonals between each corresponding pair of the first diagonals.

18. The array of claim 12 wherein the first-type of voltage supply contacts are ground contacts and the second-type of voltage supply contacts are power contacts.

19. A grid array of electrical contacts in an integrated circuit package, the grid array comprising:
    a plurality of adjacent grid boxes;
    wherein each grid box including sixteen electrical contacts arranged in a four rows of four contacts;
    wherein the sixteen electrical contacts in each grid box include twelve signal contacts, two ground contacts along a first diagonal, and two power contacts along a second diagonal; and
    wherein the first diagonal crosses the second diagonal in the grid box.

20. The grid array of claim 19 wherein the two ground contacts in each grid box are spaced-apart from each other by two adjacent signal contacts on the first diagonal; and wherein the two power contacts are adjacent to each other and spaced-apart by two signal contacts along the second diagonal in each grid box.

* * * * *